United States Patent
Childress et al.

(10) Patent No.: US 12,456,659 B2
(45) Date of Patent: Oct. 28, 2025

(54) PRINTED MICRO AND NANOSTRUCTURED ARRAYS FOR THERMAL MANAGEMENT OF ELECTRONIC DEVICES

(71) Applicant: Northeastern University, Boston, MA (US)

(72) Inventors: Anthony Childress, Boston, MA (US); Ahmed Busnaina, Needham, MA (US)

(73) Assignee: Northeastern University, Boston, MA (US)

( * ) Notice: Subject to any disclaimer, the term of this patent is extended or adjusted under 35 U.S.C. 154(b) by 748 days.

(21) Appl. No.: 17/828,551

(22) Filed: May 31, 2022

(65) Prior Publication Data

US 2022/0384302 A1    Dec. 1, 2022

Related U.S. Application Data

(60) Provisional application No. 63/194,313, filed on May 28, 2021.

(51) Int. Cl.
*H01L 23/367* (2006.01)
*B82Y 30/00* (2011.01)
*H01L 21/48* (2006.01)
*H01L 23/373* (2006.01)

(52) U.S. Cl.
CPC ...... *H01L 23/3675* (2013.01); *H01L 21/4882* (2013.01); *H01L 23/3677* (2013.01); *H01L 23/3737* (2013.01); *B82Y 30/00* (2013.01)

(58) Field of Classification Search
CPC ............ H01L 23/3675; H01L 21/4882; H01L 23/3677; H01L 23/3737; H01L 21/4871; B82Y 30/00
See application file for complete search history.

(56) References Cited

U.S. PATENT DOCUMENTS

2006/0279191 A1\* 12/2006 Geohegan ............ B82Y 30/00
                                                            313/309
2019/0189606 A1\* 6/2019 Kamphuis ............ H01L 25/50

FOREIGN PATENT DOCUMENTS

WO    2014005147 A2    1/2014

OTHER PUBLICATIONS

Ceiten et al., "Monopole antenna arrays for optical trapping", Applied Physics Letters, 98, 111110 (2011), 3 pages.
Sai et al., "High-temperature resistive surface grating for spectral control of thermal radiation", Applied Physics Letters, vol. 82, No. 11, (2003), 3 pages.
Yilmaz et al., "Three-Dimensional Crystalline and Homogeneous Metallic Nanostructures Using Directed Assembly of Nanoparticles", ACS Nano, vol. 8, No. 5, pp. 4547-4558 (2014).
Maruyama et al., "Thermal radiation from two-dimensionally confined modes in microcavities", Applied Physics Letters, vol. 79, No. 9, (2001), 3 pages.

(Continued)

*Primary Examiner* — Patricia D Valenzuela
(74) *Attorney, Agent, or Firm* — Verrill Dana, LLP (57) ABSTRACT

Systems and methods for cooling integrated circuits and other chop-based electronic devices use plasmonic absorption and emission of near infrared (NIR) radiation. Nanostructure arrays tuned to appropriate infrared wavelengths emit NIR from a hot chip substrate to other nanostructure arrays at the chip outer package, which absorb the NIR and transmit it away from the package outer surface.

25 Claims, 6 Drawing Sheets

(56) References Cited

OTHER PUBLICATIONS

Yokoyama et al., "Spectrally Selective Mid-Infrared Thermal Emission from Molybdenum Plasmonic Metamaterial Operated up to 1000° C.", Adv. Opt. Mater., (2016), 6 pages.
Tsuda et al., "Thermal Management Technique Using Control of Thermal Radiation Spectrum for Encapsulated Electronic Devices", IEEE Trans. Components, Packag. Manuf. Technol. 5, pp. 971-979 (2015).
Heinzel et al., "Microstructured tungsten surfaces as selective emitters", American Institute of Physics, 460, pp. 191-196 (1999).

* cited by examiner

PRINTED MICRO AND NANOSTRUCTURED ARRAYS FOR THERMAL MANAGEMENT OF ELECTRONIC DEVICES

CROSS-REFERENCE TO RELATED APPLICATIONS

This application claims priority to U.S. Provisional Application No. 63/194,313, filed 28 May 2021, which is hereby incorporated by reference in its entirety.

BACKGROUND

Integrated circuits such as graphics chips, microprocessor chips, and memory chips are increasingly made with higher transistor density and faster performance. Chip miniaturization and greater performance typically leads to higher heat generation, which increases the electrical resistance of the circuits. Increasing the core frequency of an existing microprocessor can improve performance but severely shortens lifetime due to heat. Desktop, graphics, and laptop computers have been designed with internal cooling fans to help dissipate heat away from metallic parts, but cooling fans can cause increased noise, consume power, and take up valuable space.

Controlling thermal emission via nanostructures was implemented for use with thermal photovoltaic cell as described in Heinzel, et al., 1999. Microscale thermal emitters also have been characterized by Maruyama, et al., 2001; Sai, et al., 2003; Yokoyama, et al., 2016; and Tsuda, et al., 2015.

Improved technologies are needed for thermal management of electronic devices.

SUMMARY

The technology described herein provides thermal management for integrated circuits and other chip-based electronic devices. The technology provides controlled radiation heat transfer through printed micro and nanostructures to improve the cooling rate of chip scale electronics. Cooling elements including nanoscale emitter grids and/or radiation absorbing pillars can be printed to provide a controlled enhanced emission and absorption in the near infrared (NIR) spectrum, which is the wavelength range from about 780 nm to about 2500 nm. The cooling element is tuned to emit thermal radiation in a NIR wavelength or wavelength band so as to transfer thermal radiation from a heat-producing electronic component. The cooling element can be fabricated on chip or on or in packaging material. In some embodiments, NIR radiation emitted by the cooling element is absorbed at the outer package housing of the chip by photonic absorption of a nanostructure absorber and re-emitted outside the device by a second nanoscale or microscale emitter grid.

An aspect of the present technology is a thermal management system for a chip-based electronic device. The system includes first and second thermal emitters. Each of the emitters contains nanoscale or microscale electrically conductive structures. The first emitter is in thermal contact with a heat-producing electronic component of the device, and is configured to absorb thermal energy from the component and emit NIR radiation away from the component, including towards the outer package of the device. The second emitter is in thermal contact with an outer surface of the outer package, and is configured to absorb thermal energy from the outer package and emit NIR radiation away from the outer package, into the environment of the device, so as to cool the device. Thermal energy absorbed from the outer package and irradiated out into the environment by the second emitter includes thermal energy radiated away from the electronic component by the first emitter. The thermal management system can optionally include a thermal absorber disposed on an inner surface of the outer package. The thermal absorber absorbs NIR radiation emitted by the first emitter and transmits heat energy to the second emitter, further increasing the efficiency of heat removal from the device. The thermal absorber contains an array of electrically conductive nanostructures, such as nanopillars formed from metallic nanoparticles or electrically conductive polymer or carbon materials, each having size dimensions in the microscale or nanoscale range. The array has a pitch (repeat distance of the nanostructures) in the microscale or nanoscale range. The nanostructures of the thermal absorber optionally are encapsulated in a dielectric material capable of transmitting the NIR radiation emitted by the first emitter.

Another aspect of the technology is a thermal management system for a chip-based electronic device that includes a first thermal emitter and a thermal absorber. The emitter is in thermal contact with a heat-producing electronic component of the device and absorbs thermal energy from the component and emits NIR radiation away from the component, including towards the absorber. The thermal absorber is disposed on the inner surface of the outer package of the device, absorbs NIR radiation emitted by the first emitters and transmits heat energy to the outer package where it can be radiated away from the device. The emitter thereby increases the efficiency of heat removal. The thermal absorber contains an array of electrically conductive nanostructures, such as nanopillars formed from metallic nanoparticles or electrically conductive polymer or carbon materials, each having size dimensions in the microscale or nanoscale range. The array has a pitch (repeat distance of the nanostructures) in the microscale or nanoscale range. The nanostructures of the thermal absorber optionally are encapsulated in a dielectric material capable of transmitting the NIR radiation emitted by the first emitter. The system optionally further includes a second thermal emitter in thermal contact with the outer surface of the outer package; optionally, the second emitter is aligned with the thermal absorber positioned on the inner surface of the package. The second emitter is configured to absorb thermal energy from the absorber and outer package, and emits NIR radiation away from the outer package. The thermal energy absorbed from the outer package comprises thermal energy radiated away from the component by the first emitter.

Yet another aspect of the present technology is a method of fabricating a cooling system for a chip-based electronic device. The method includes providing an electrical component of the device, printing or assembling a first microscale or nanoscale thermal emitter in thermal contact with the component, and printing or assembling a second microscale or nanoscale thermal emitter in thermal contact with an outer surface of an outer package of the device. The first emitter absorbs energy from the component and transmits NIR radiation to the outer package of the device. The second emitter absorbs thermal energy from the outer package and emits NIR radiation away from the outer package. The method optionally further includes printing or assembling a thermal absorber on the inner surface of the outer package of the electronic device. The absorber absorbs NIR radiation emitted by the first emitter and transmits heat energy to the outer package. The thermal absorber contains an array of electrically conductive nanostructures, such as nanopillars formed from metallic nanoparticles or electrically conductive polymer or carbon materials, each having size dimensions in the microscale or nanoscale range. The array has a pitch (repeat distance of the nanostructures) in the microscale or nanoscale range. The nanostructures of the thermal absorber optionally are encapsulated in a dielectric material capable of transmitting the NIR radiation emitted by the first emitter.

Still another aspect of the present technology is a method of fabricating a cooling system for a chip-based electronic device. The method includes providing a component of the device, printing or assembling a first thermal emitter in thermal contact with the component and printing or assembling a thermal absorber on the inner surface of the outer package of the electronic device. The absorber absorbs NIR radiation emitted by the first emitter and transmits heat energy to the outer package. The thermal absorber contains an array of electrically conductive nanostructures, such as nanopillars formed from metallic nanoparticles or electrically conductive polymer or carbon materials, each having size dimensions in the microscale or nanoscale range. The array has a pitch (repeat distance of the nanostructures) in the microscale or nanoscale range. The nanostructures of the thermal absorber optionally are encapsulated in a dielectric material capable of transmitting the NIR radiation emitted by the first emitter. The method optionally includes the further step of printing or assembling a second emitter in thermal contact with the outer surface of the outer package of the device; the second emitter configured to absorb thermal energy from the outer package and emit NIR radiation away from the outer package.

The present technology can be further summarized by the following list of features.

1. A thermal management system for a chip-based electronic device, the system comprising:
   a first microscale or nanoscale thermal emitter in thermal contact with a heat-producing electronic component, the first emitter configured to absorb thermal energy from the component and emit near infrared (NIR) radiation away from the component; and
   a second microscale or nanoscale thermal emitter in thermal contact with an outer surface of an outer package of the electronic device, the second emitter configured to absorb thermal energy from the outer package and emit NIR radiation away from the outer package, wherein the thermal energy absorbed from the outer package comprises thermal energy radiated away from said component by the first emitter.
2. The system of feature 1, further comprising:
   a thermal absorber disposed on an inner surface of said outer package and operative to absorb said NIR radiation emitted by the first emitter and transmit heat energy to the second emitter; wherein the thermal absorber comprises an array of electrically conductive nanostructures, each having size dimensions in the microscale or nanoscale range and the array having a pitch in the microscale or nanoscale range.
3. The system of feature 2, wherein the nanostructures of the thermal absorber are encapsulated in a dielectric material capable of transmitting the NIR radiation emitted by the first emitter.
4. The system of any of the preceding features, wherein the first and second thermal emitters each have an aperture size, periodicity, wall thickness, and depth of grid structure are tuned to emit NIR radiation.
5. The system of feature 4, wherein the aperture size is about 1 μm and the wall thickness is about 200 nm.
6. The system of feature 2, wherein the nanostructures have a height of about 400 nm and a diameter in the range from about 100 nm to about 250 nm.
7. The system of feature 3, wherein the dielectric material comprises bisbenzocyclobutene electronic resin, polyvinylidene chloride or polyvinylidene dichloride, polyethylene terephthalate, polycarbonate, poly(methyl methacrylate), polytetrafluoroethylene, polypropylene, polyethylene, or a chloroprene polymer.
8. The system of any of the preceding features, wherein the heat-producing electronic component comprises is an interconnect or metallization.
9. The system of any of the preceding features, wherein the first emitter and/or second emitter is printed or assembled directly onto the heat-producing electronic component (first emitter) or outer packaging (second emitter).
10. A thermal management system for a chip-based electronic device, the system comprising:
    a first microscale or nanoscale thermal emitter in thermal contact with a heat-producing electronic component, the first emitter configured to absorb thermal energy from the component and emit near infrared (NIR) radiation away from the component; and
    a thermal absorber disposed on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.
11. The system of feature 10, further comprising:
    a second microscale or nanoscale thermal emitter in thermal contact with an outer surface of said outer package, the second emitter configured to absorb thermal energy from the absorber and emit NIR radiation away from the outer package, wherein the thermal energy absorbed from the outer package comprises thermal energy radiated away from said component by the first emitter.
12. A method of fabricating a cooling system for a chip-based electronic device, the method comprising the steps of:
    (a) providing a component of the device;
    (b) printing or assembling a first microscale or nanoscale thermal emitter in thermal contact with the component; the first emitter configured to absorb thermal energy from the component and emit NIR radiation away from the component; and
    (c) printing or assembling a second microscale or nanoscale thermal emitter in thermal contact with an outer surface of an outer package of the device; the second emitter configured to absorb thermal energy from the outer package and emit NIR radiation away from the outer package.
13. The method of feature 12, further comprising the step of:
    (d) printing or assembling a thermal absorber on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.
14. The method of feature 13, further comprising the step of:

(e) encapsulating the nanostructures of the absorber in a dielectric material capable of transmitting the NIR radiation emitted by the first emitter.

15. The method of any of features 12-14, wherein the first emitter is printed or assembled at a location that provides thermal stress or forms a hot spot of the component.

16. The method of feature 12, wherein a plurality of first and second thermal emitters are printed or assembled at different locations in the device.

17. A method of fabricating a cooling system for a chip-based electronic device, the method comprising the steps of:
   (a) providing a component of the device;
   (b) printing or assembling a first microscale or nanoscale thermal emitter in thermal contact with the component; the first emitter configured to absorb thermal energy from the component and emit NIR radiation away from the component; and
   (c) printing or assembling a thermal absorber on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.

18. The method of feature 17, further comprising the step of:
   (d) printing or assembling a second microscale or nanoscale thermal emitter in thermal contact with an outer surface of an outer package of the device; the second emitter configured to absorb thermal energy from the outer package and emit NIR radiation away from the outer package.

19. The method of feature 17 or 18, further comprising the step of:
   (e) encapsulating the nanostructures of the absorber in a dielectric material capable of transmitting the NIR radiation emitted by the first emitter.

20. The method of any of features 17-19, wherein the first emitter is printed or assembled at a location that provides thermal stress or forms a hot spot of the component.

21. The method of any of features 17-20, wherein a plurality of first emitters and absorbers are printed or assembled at different locations in the device.

22. A method for cooling a chip-based electronic device, the method comprising the steps of:
   (a) providing a chip-based electronic device comprising the system of feature 1; and
   (b) operating the device, whereby the device is cooled by passive operation of the system.

23. The method of feature 22, wherein the device is operated at a temperature from about 100° C. to about 250° C., and wherein passive operation of the cooling system provides from about 10% to about 49% of cooling power for the device.

24. A method for cooling a chip-based electronic device, the method comprising the steps of:
   (a) providing a chip-based electronic device comprising the system of feature 10; and
   (b) operating the device, whereby the device is cooled by passive operation of the system.

25. The method of feature 24, wherein the device is operated at a temperature from about 100° C. to about 250° C., and wherein passive operation of the cooling system provides from about 10% to about 49% of cooling power for the device.

As used herein, the term "nanoscale" refers to structures having at least one dimension in the range from about 1 nm to about 999 nm, and the term "microscale" refers to structures having at least one dimension in the range from about 1 μm to about 999 μm.

As used herein, the term "about" refers to a range of within plus or minus 10%, 5%, 1%, or 0.5% of the stated value.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with the alternative expression "consisting of" or "consisting essentially of".

BRIEF DESCRIPTION OF THE DRAWINGS

FIG. 1A shows an embodiment of a cooling system for a chip-based electronic device. The system comprises components disposed at chip substrate 10 as well as optional components disposed at chip outer package 20. Cooling elements include first grid emitter 50 disposed on a selected area of hot substrate 40 and second grid emitter 55 disposed on an outer surface of outer packaging substrate 30. Nanopillar absorber 60 is disposed on an inner surface of outer packaging substrate 30. NIR radiation emitted by the first emitter is shown as 15, and NIR radiation emitted by the second emitter is shown as 16.

DETAILED DESCRIPTION

The technology described herein provides systems and methods for enhanced cooling and thermal management of electronic devices such as microchips. In one embodiment, thermal management is achieved by tuning the emission wavelength band of a nanoscale emitter device, for example tuning emission to the NIR, such that the emitted thermal radiation can pass with little or no attenuation through a dielectric encapsulant, which has an absorption minimum at the NIR band of the emitter. The nanoscale or microscale thermal emitter is a passive element that can be applied directly to integrated circuits at one or more locations so as to mitigate thermal stress at hot spots where thermal management is most needed. The emitter of the present technology can be combined with other thermal management measures, including traditional thermal management methods that draw heat away from the underside of a circuit element without targeting specific areas. The ease of application of the present technology allows circuit elements to remain modular, as it does not require sealing within a solid layer for heat dissipation. Nanoscale or microscale thermal emitters can also be applied to other packaging components, such as an outer packaging or housing of the chip, thereby enhancing the overall heat dissipation, including when used in conjunction with traditional methods.

The present technology can have a variety of applications in addition to cooling of integrated circuits. For example, it can be used for cooling of power electronics used in radar, charging stations, power equipment, other higher voltage electrical equipment, and aerospace system integration. The technology can enhance heat transfer performance, in some instances by more than 50%, simply by printing suitable nanostructures, such as nanopillar arrays and/or nanoscale or microscale grids, at relevant locations. The technology also can be integrated with outer packaging, In the field of power electronics, the need for heat dissipation is paramount. The industry is also tending towards modular chip design as opposed to monolithic chip assemblies. Current technology relies on transferring heat from a chip to the board via metal channels and then to heat sinks which dissipate the heat to external flowing air or having local metal fins connected directly to the encapsulation material for heat dissipation. This method of cooling can become cumbersome when dealing with small chips that must be placed in close proximity. Another approach is to encapsulate a chip set in solid metal to dissipate heat via conduction, but this requires a relatively thick layer of metal to be applied that must then be planarized via chemical mechanical polishing. This method has yet to be proven effective and would not be amenable to the design of modular chip sets.

Figure 1A:
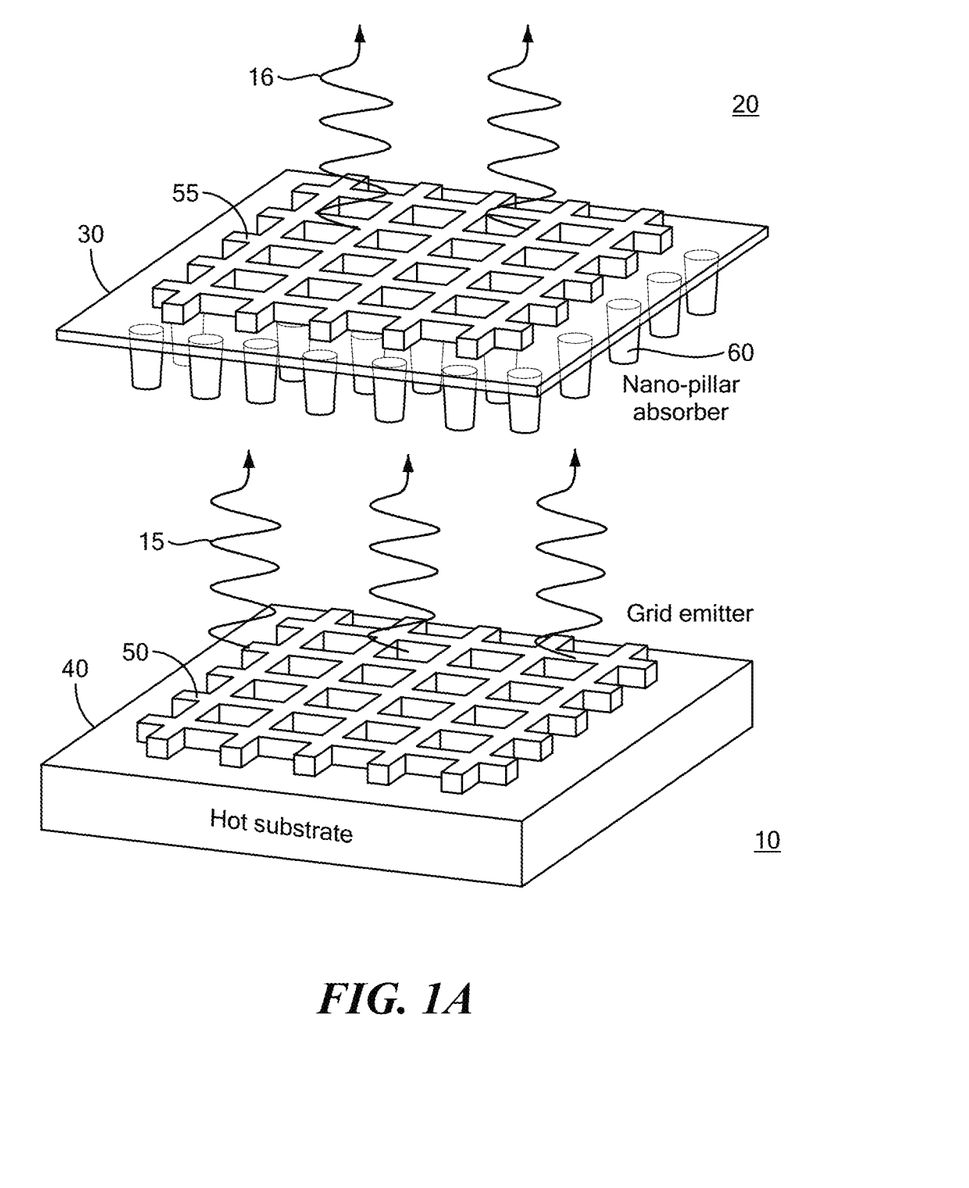

The virtue of the technology described herein is that the nanostructured cooling elements are passive elements that can be applied to the chips or to different layers of packaging, enabling them to be used for future modular chip designs. For instance, they can be applied at the level of the integrated circuits in the area of metallization and interconnects, helping to mitigate hot spots. They can be applied to chips prior to encapsulation to add an additional method of cooling in addition to conduction through the encapsulation. This is made possible by tuning the thermal emission spectrum to the NIR range such that the absorbance by the encapsulant is minimal, allowing the heat to escape directly to the exterior of the chip. The elements can also be applied to the outside of the packaged chip to achieve the same effect, as illustrated in FIG. 1A. The example depicted in FIG. 1A shows cooling elements involving an outer packaging material 30. The chip 40 and outer packaging 30 each have a nanostructured and/or microstructured grid emitter 50, 55 while the interior of the outer package has a nanopillar absorber 60.

Figure 1B:
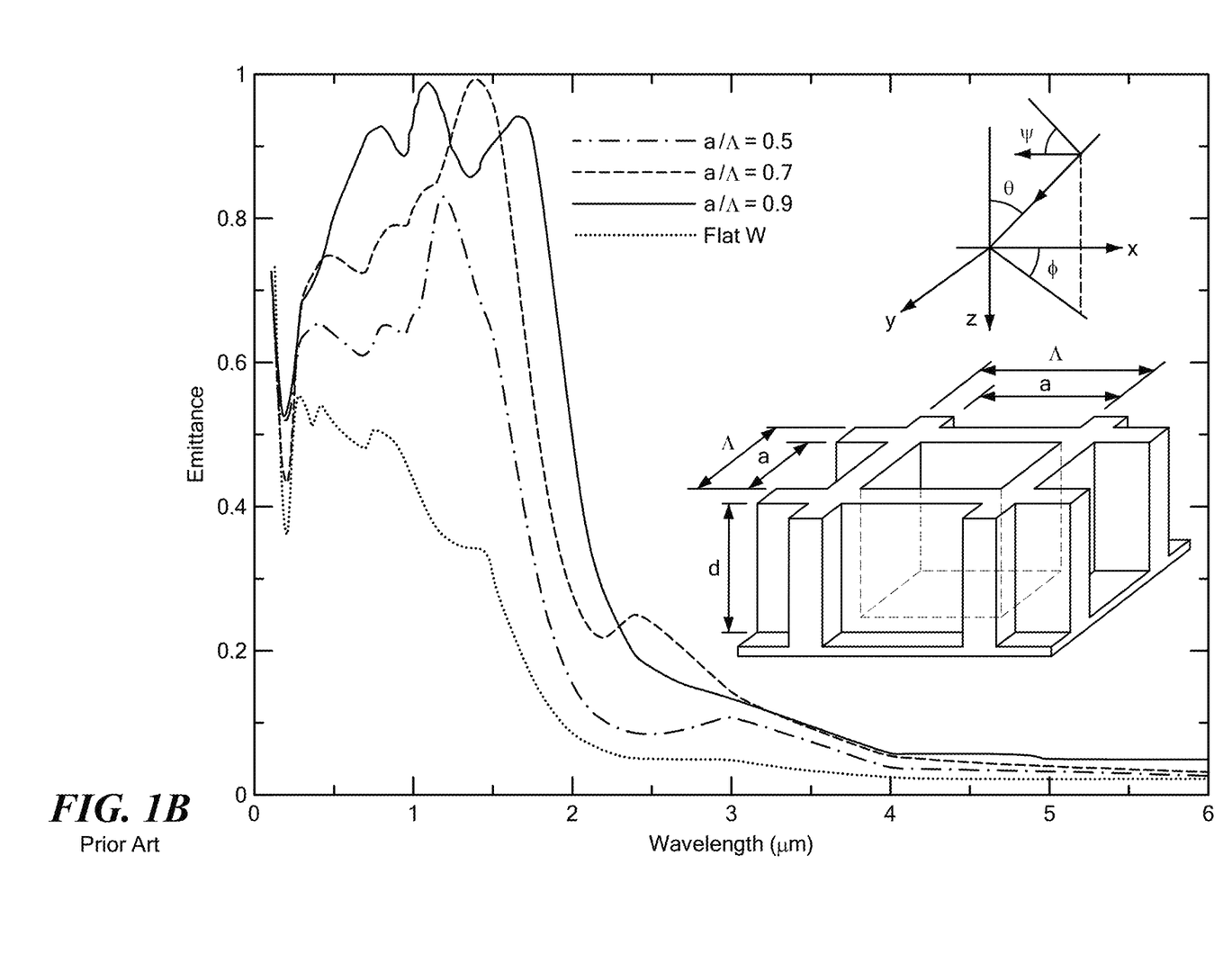
FIG. 1B is a graph of emission spectra calculated as a function of grid parameters.

The effect of controlling the emission spectrum is based on the optical resonance characteristics of a cavity, similar to a waveguide or resonance cavity that is used to direct microwaves. For this reason, a nanostructured or microstructured grid wherein the cavities are similar in dimension to the desired emission wavelength can be used as the resonance feature. The size and spacing of the grating apertures can be used to tune the emission band to NIR wavelengths, thereby increasing the emissivity in the desired region. Using the rigorous coupled wave analysis method, the emission spectrum can be determined as a function of the aperture size, periodicity, and depth. FIG. 1B shows an example of calculations made by varying the aperture/periodicity ratio as found in Sai, et al., 2003. Typically, the aperture is about 1 µm with a periodicity of about 1.2 µm, meaning the wall between apertures is about 200 nm. Using this method, the absorbance and emissivity can be enhanced to near unity for the intended NIR band.

Figure 1C:
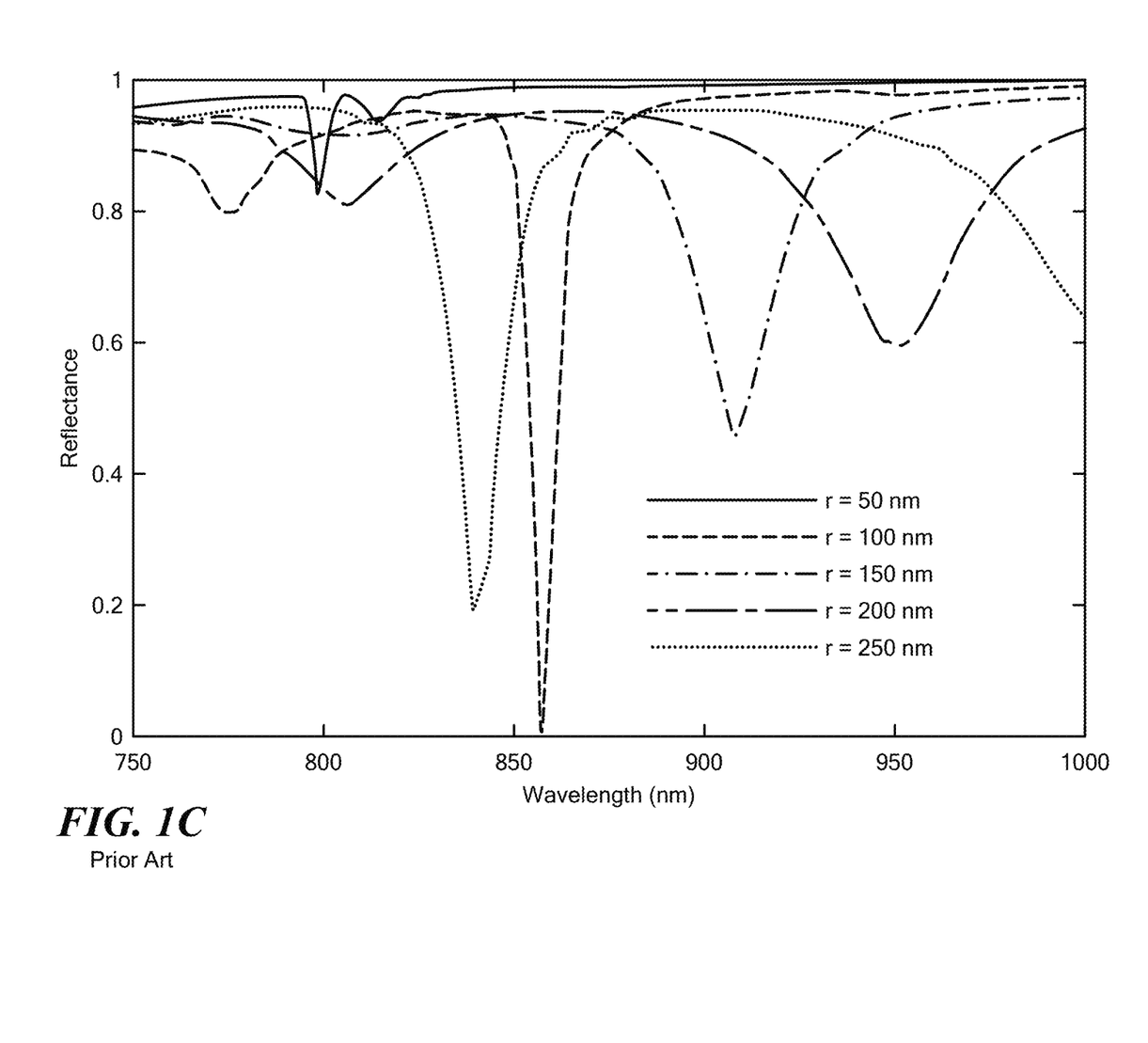
FIG. 1C is a graph of reflectance of nanopillar arrays 400 nm in height with various radii.

The principle of tuning the absorbance and emission band via nanostructures can also be accomplished by arrays of electrically conductive pillars. This has been demonstrated in previous work, as shown in FIG. 1C (cetin, et al., 2011; Yilmaz, et al., 2014). In this case, the resonance is accomplished via the plasmonic response of the nanomaterials, and can be tuned by adjusting the height, diameter, and pitch of the pillars. It is found that a height of 400 nm is optimum with regards to absorbance in the NIR, with increased height leading to less absorbance and a broadening absorbance band. The diameter of the pillars correlates with a redshift of the absorbance, where diameters of 100-250 show a strong response in the NIR (FIG. 1C).

Figure 2A:
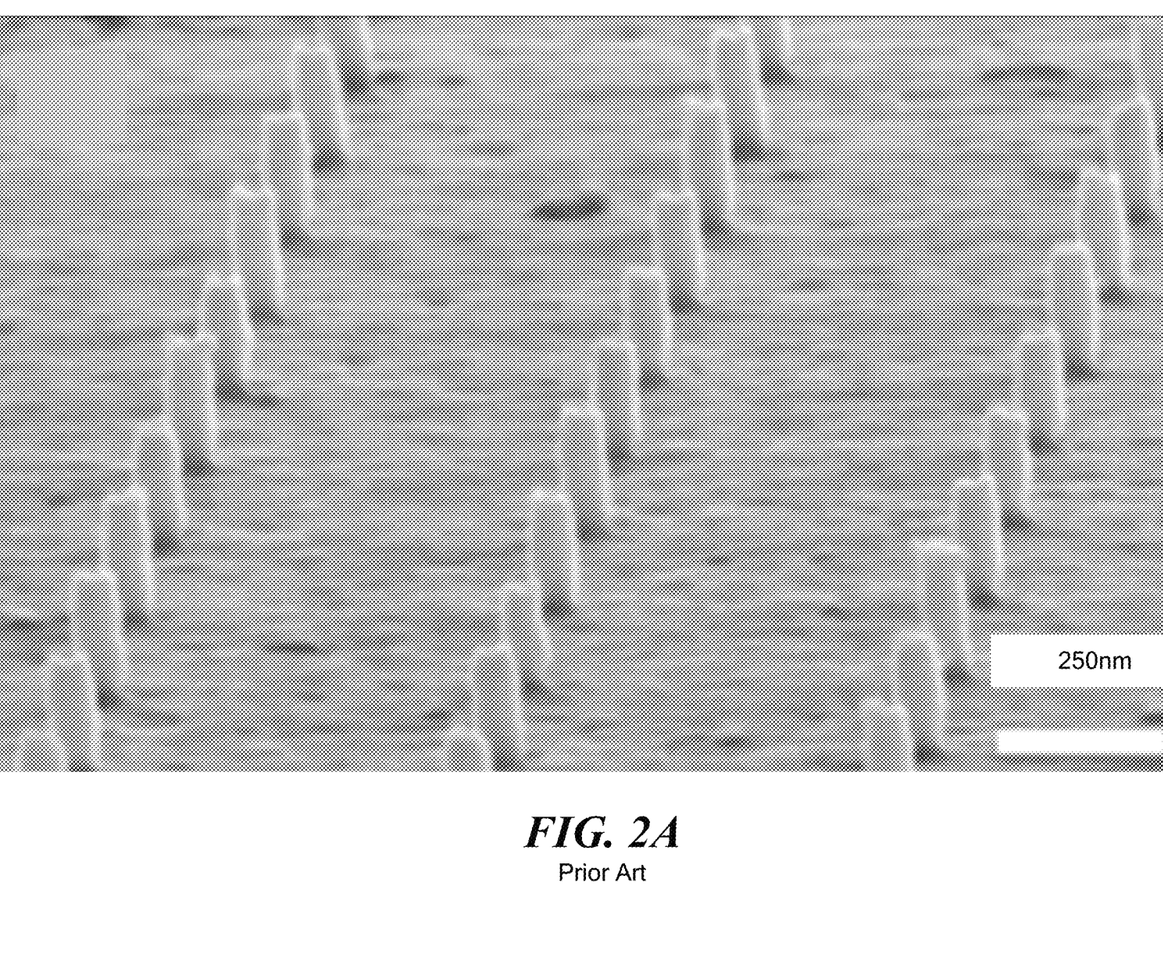
FIG. 2A is a scanning electron microscope (SEM) image of nanopillar arrays assembled from 20 nm gold nanoparticles.
Figure 2B:
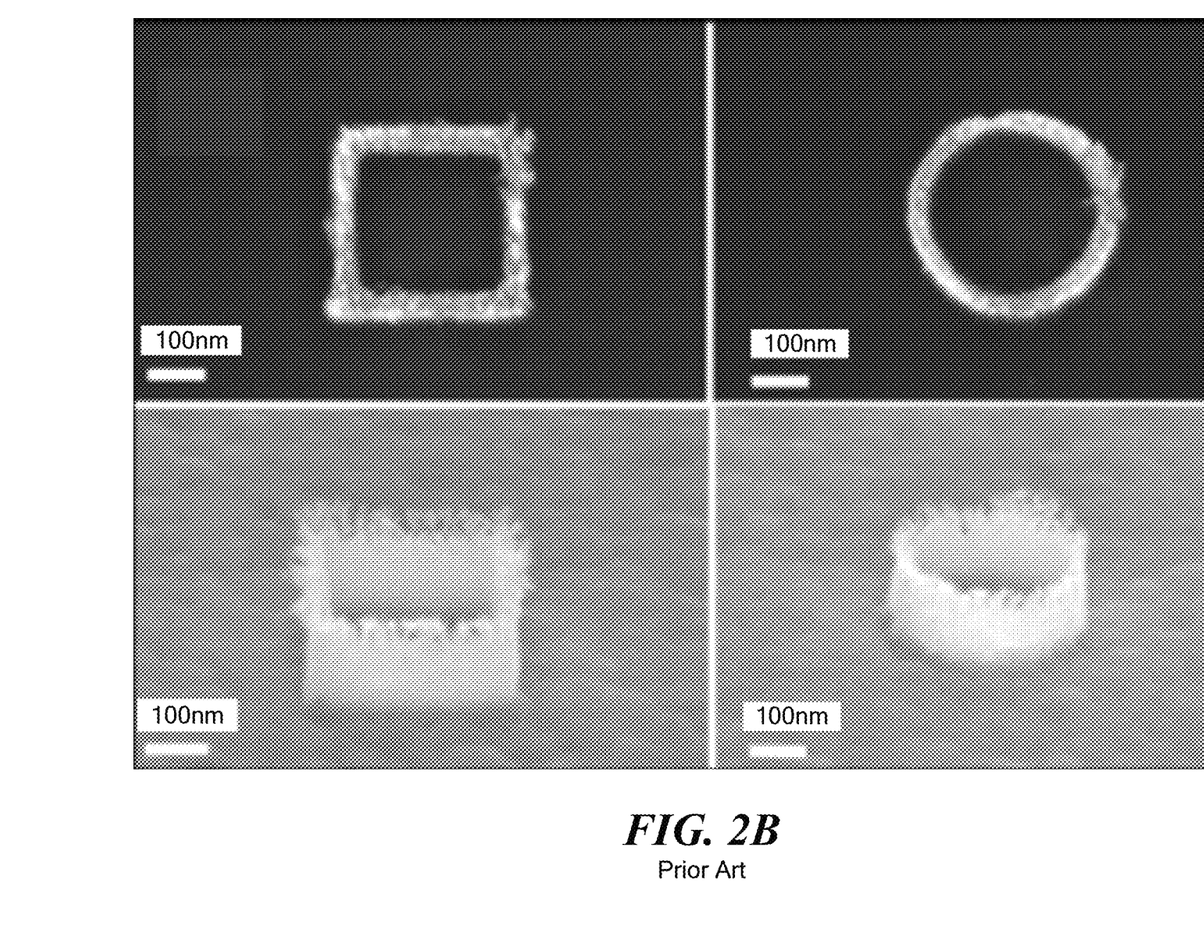
FIG. 2B shows SEM images of boxes and rings assembled via dielectrophoresis of gold nanoparticles.

Methods that can be used for large scale printing of the electrically conductive nanostructured emitters are electrophoresis and dielectrophoresis where DC and AC currents are used to assemble nanoparticles within vias. The fluidic and convective assembly methods may be used in the case of insulating substrates, and these methods rely on capillary forces for the assembly of nanoparticles. FIG. 2A shows assembled nanopillar arrays, while FIG. 2B shows that shapes of arbitrary design can also be achieved, which can prove useful for assembling nanoscale grid emitters. The assembly process is lift-off free, low cost, does not require vacuum, and is simpler than traditional microfabrication methods. Methods of fabricating nanostructures of electric field directed assembly of nanoelements and nanostructures fabricated by nanoelement assembly are described in WO 2014/005147, "Three-Dimensional Crystalline, Homogeneous, and Hybrid Nanostructures Fabricated by Electric Field Directed Assembly of Nanoelements," which is incorporated by reference herein in its entirety.

The technology described herein uses the aforementioned assembly methods to apply nanostructured cooling elements to hot spots on electronic components in order to boost the thermal emission. The cooling elements can also be applied to the outer packaging if possible. One aspect can involve combining the absorbers and emitters in order to maximize their effectiveness, as portrayed by the example in FIG. 1A. In the case that there is a small gap between the element and the outer packaging, the emission spectra can be tuned to a band where the packaging absorbs the least, allowing the NIR radiation to escape more easily. Another approach is to tune the emission of the element at the hot spot to coincide with an absorber on the inner sider of the packaging while having an additional emitter on the outer side of the packaging as in FIG. 1A. The feasibility of these approaches can be determined through an experimental apparatus wherein there is a heated surface of known temperature and heating rate in close proximity to a surface that serves as an analog for the packaging material. Modeling has also been carried out using COMSOL Multiphysics to estimate the cooling power of the elements compared to convection, as mentioned below. By applying the cooling elements to various surfaces in the apparatus and monitoring the temperature at key sites, the cooling efficacy can be determined. Being that the elements are passive components on the chips, they can be implemented in tandem with other cooling methods.

Electrically conductive nanostructures such as nanopillars or grids can be embedded or encased in a dielectric material to improve or tune their responses. Examples of dielectric materials or resins that can be used to encapsulate electrically conductive nanopillars or other electrically conductive nanostructures are polyethylene, polypropylene, polytetrafluoroethylene, polyethylene terephthalate, polycarbonate, poly(methyl methacrylate), polystyrene, polyimide, bisbenzocyclobutene resin, polyvinylidene chloride, titanium dioxide, strontium titanate, barium strontium titanate, barium titanate, and calcium copper titanate. Dielectric materials can be applied by known methods such as spin coating.

Alternatively, a negative photoresist can be used as the dielectric material, the vias to form nanostructures patterned by electron beam lithography or photolithography and solvent removal to create the vias, followed by assembly of nanoparticles or other nanoelements in the vias, such as by electrophoresis, dielectrophoresis, flow-mediated assembly, or other known methods.

The technology described herein addresses several challenges. One challenge is implementing the cooling elements with current packaging trends in mind. It may be that the elements are to be applied to a chip after it has been assembled. This can prove difficult since the vias used to assemble the nanostructures must be patterned using electron beam lithography, which requires a layer of polymer to be applied and then removed after assembly. This necessity of fabrication can limit the type of chip on which the cooling elements can be applied. Another issue is whether the elements can cause interference in chips operating at RF frequencies. Any inductive effects of the elements need to be accounted for in the impedance of the RF circuit. Another challenge is to optimize the size and spacing of the elements using the nanomaterials available for printing. Candidate nanoparticles which can be printed with relative ease include silver, gold, and copper, though in some cases the oxidation of copper may be detrimental to such a degree as to render a copper cooling element impractical.

Figure 3:
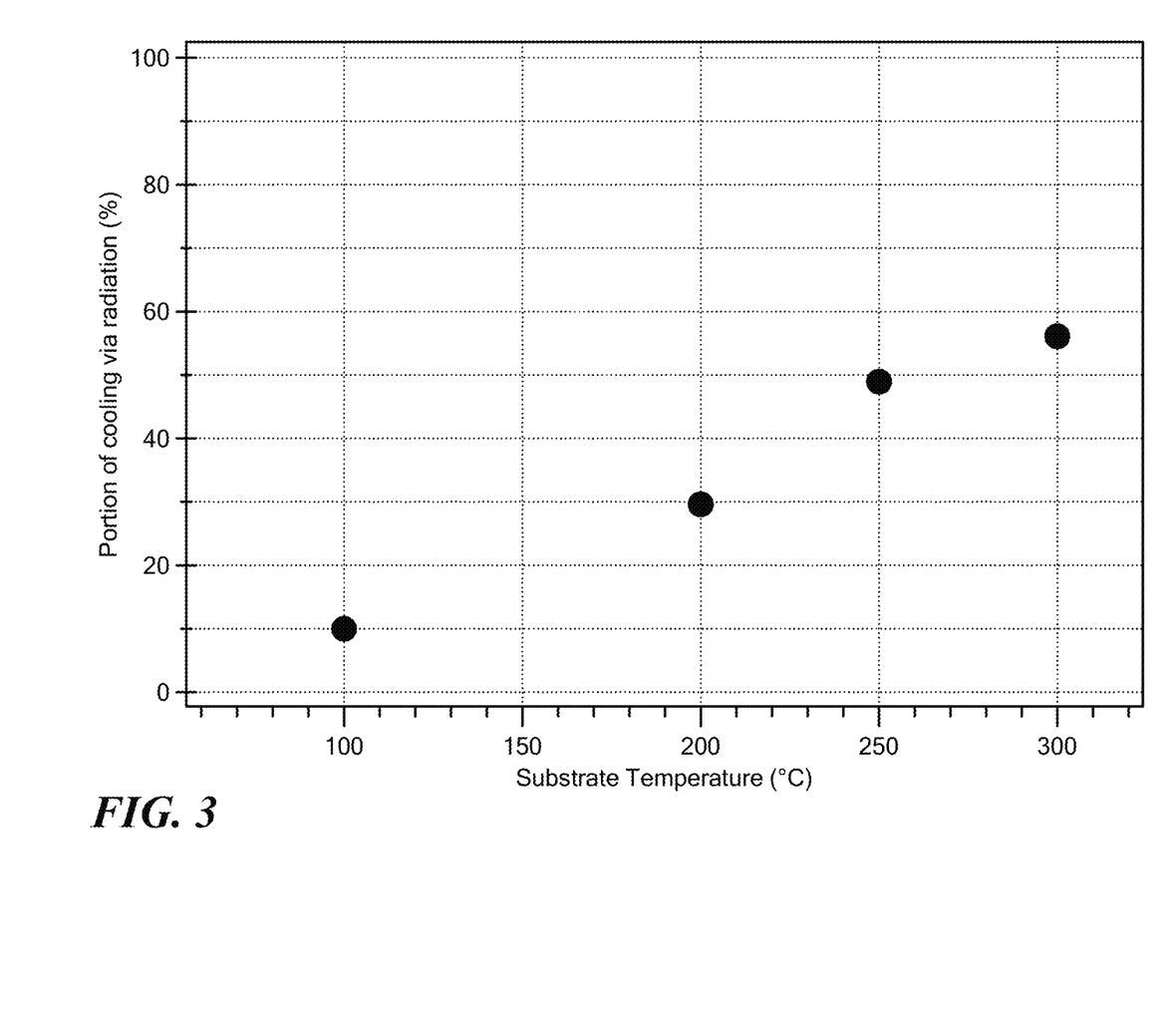
FIG. 3 is a graph of cooling by means of radiation vs. substrate temperature.

In order to estimate the effectiveness of the cooling elements, a system was modeled using COMSOL Multiphysics software. A model substrate was heated with a varying heat flux ranging from 0.12 W·cm$^{-2}$ to 0.75 W·cm$^{-2}$, and the heat was dissipated from its surface via convection and radiation. The emissivity of the surface and bandwidth of the thermal radiation were selected to approximate the expected capabilities of the cooling elements. With this model, it was found that the cooling elements contributed more to the overall cooling as the temperature increased (FIG. 3). In FIG. 3, at the lowest substrate temperature of 100° C., radiation contributes 10% of cooling power, while a contribution of 49% is had at 250° C. This is a significant boost to cooling that can prove useful for protecting hot spots. The magnitude of thermal radiation in the lower range of operating temperatures may be small when compared to conduction and convective cooling pathways, but the effect cannot be ignored in situations where conductive cooling pathways are limited, such as mobile electronics, or in the case of chips encapsulated in resin. One implementation can involve tuning the spectra such that the emission corresponds to a band where the resin has low absorption, thus the NIR radiation from the emitter may pass through the resin packaging, resulting in greater cooling.

The cooling technology described herein can provide further improvement in chip performance by reducing hot spots in certain types of chips. The method can be applied to chips before encapsulation, or to the packaging itself, making it amenable to modular chip designs. The technology can also further the technology of nanostructure printing that can enable low-cost manufacture of such nanostructured absorbers and emitters. The technology does not use any liquids or pumps to flow cooling liquids to transfer heat from the chip to another area for dissipation. This means a very small and compact and less complicated efficient cooling system that is tuned to the wavelength of the radiation to be transferred.

REFERENCES

[1] A. Heinzel, V. Boerner, A. Gombert, V. Wittwer, and J. Luther, in *AIP Conf. Proc.* (American Institute of Physics, 1999), pp. 191-196.

[2] S. Maruyama, T. Kashiwa, H. Yugami, and M. Esashi, Appl. Phys. Lett. 79, 1393 (2001).

[3] H. Sai, Y. Kanamori, and H. Yugami, Appl. Phys. Lett. 82, 1685 (2003).

[4] T. Yokoyama, T. D. Dao, K. Chen, S. Ishii, R. P. Sugavaneshwar, M. Kitajima, and T. Nagao, Adv. Opt. Mater. 4, 1987 (2016).

[5] S. Tsuda, M. Shimizu, F. Iguchi, and H. Yugami, IEEE Trans. Components, Packag. Manuf. Technol. 5, 971 (2015).

[6] A. E. Ç etin, A. A. Yanik, C. Yilmaz, S. Somu, A. Busnaina, and H. Altug, Appl. Phys. Lett. 98, 111110 (2011).

[7] C. Yilmaz, A. E. Cetin, G. Goutzamanidis, J. Huang, S. Somu, H. Altug, D. Wei, and A. Busnaina, ACS Nano 8, 4547 (2014).

What is claimed is:

1. A thermal management system for a chip-based electronic device, the system comprising:
   a first microscale or nanoscale thermal emitter in thermal contact with a heat-producing electronic component, the first emitter configured to absorb thermal energy from the component and emit near infrared (NIR) radiation away from the component, wherein the first emitter is configured as a grid structure; and
   a second microscale or nanoscale thermal emitter in thermal contact with an outer surface of an outer package of the electronic device, the second emitter configured to absorb thermal energy from the outer package and emit NIR radiation away from the outer package, wherein the thermal energy absorbed from the outer package comprises thermal energy radiated away from said component by the first emitter, wherein the second emitter is configured as a grid structure.

2. The system of claim 1, further comprising:
   a thermal absorber disposed on an inner surface of said outer package and operative to absorb said NIR radiation emitted by the first emitter and transmit heat energy to the second emitter; wherein the thermal absorber comprises an array of electrically conductive nanostructures, each having size dimensions in the microscale or nanoscale range and the array having a pitch in the microscale or nanoscale range.

3. The system of claim 2, wherein the nanostructures of the thermal absorber are encapsulated in a dielectric material capable of transmitting the NIR radiation emitted by the first emitter.

4. The system of claim 1, wherein the grid structures of the first and second thermal emitters each have an aperture size, periodicity, wall thickness, and depth of grid structure tuned to emit NIR radiation.

5. The system of claim 4, wherein the aperture size is about 1 μm and the wall thickness is about 200 nm.

6. The system of claim 2, wherein the nanostructures have a height of about 400 nm and a diameter in the range from about 100 nm to about 250 nm.

7. The system of claim 3, wherein the dielectric material comprises bisbenzocyclobutene electronic resin, polyvinylidene chloride or polyvinylidene dichloride, polyethylene terephthalate, polycarbonate, poly(methyl methacrylate), polytetrafluoroethylene, polypropylene, polyethylene, or a chloroprene polymer.

8. The system of claim 1, wherein the heat-producing electronic component comprises is an interconnect or metallization.

9. The system of claim 1, wherein the first emitter and/or second emitter is printed or assembled directly onto the heat-producing electronic component (first emitter) or outer packaging (second emitter).

10. A method for cooling a chip-based electronic device, the method comprising the steps of:
(a) providing a chip-based electronic device comprising the system of claim 1; and
(b) operating the device, whereby the device is cooled by passive operation of the system.

11. The method of claim 10, wherein the device is operated at a temperature from about 100° C. to about 250° C., and wherein passive operation of the cooling system provides from about 10% to about 49% of cooling power for the device.

12. A thermal management system for a chip-based electronic device, the system comprising:
a first microscale or nanoscale thermal emitter in thermal contact with a heat-producing electronic component, the first emitter configured to absorb thermal energy from the component and emit near infrared (NIR) radiation away from the component, wherein the first emitter is configured as a grid structure; and
a thermal absorber disposed on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.

13. The system of claim 12, further comprising:
a second microscale or nanoscale thermal emitter in thermal contact with an outer surface of said outer package, the second emitter configured to absorb thermal energy from the absorber and emit NIR radiation away from the outer package, wherein the thermal energy absorbed from the outer package comprises thermal energy radiated away from said component by the first emitter.

14. A method for cooling a chip-based electronic device, the method comprising the steps of:
(a) providing a chip-based electronic device comprising the system of claim 10; and
(b) operating the device, whereby the device is cooled by passive operation of the system.

15. The method of claim 14, wherein the device is operated at a temperature from about 100° C. to about 250° C., and wherein passive operation of the cooling system provides from about 10% to about 49% of cooling power for the device.

16. A method of fabricating a cooling system for a chip-based electronic device, the method comprising the steps of:
(a) providing a component of the device;
(b) printing or assembling a first microscale or nanoscale thermal emitter in thermal contact with the component; the first emitter configured to absorb thermal energy from the component and emit NIR radiation away from the component, wherein the first emitter is configured as a grid structure; and
(c) printing or assembling a second microscale or nanoscale thermal emitter in thermal contact with an outer surface of an outer package of the device; the second emitter configured to absorb thermal energy from the outer package and emit NIR radiation away from the outer package, wherein the second emitter is configured as a grid structure.

17. The method of claim 16, further comprising the step of:
(d) printing or assembling a thermal absorber on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.

18. The method of claim 17, further comprising the step of:
(e) encapsulating the nanostructures of the absorber in a dielectric material capable of transmitting the NIR radiation emitted by the first emitter.

19. The method of claim 16, wherein the first emitter is printed or assembled at a location that provides thermal stress or forms a hot spot of the component.

20. The method of claim 16, wherein a plurality of first and second thermal emitters are printed or assembled at different locations in the device.

21. A method of fabricating a cooling system for a chip-based electronic device, the method comprising the steps of:
(a) providing a component of the device;
(b) printing or assembling a first microscale or nanoscale thermal emitter in thermal contact with the component; the first emitter configured to absorb thermal energy from the component and emit NIR radiation away from the component, wherein the first emitter is configured as a grid structure; and
(c) printing or assembling a thermal absorber on an inner surface of an outer package of the electronic device, the absorber operative to absorb said NIR radiation emitted by the first emitter and transmit heat energy to the outer package; wherein the thermal absorber comprises an array of electrically conductive nanostructures, each having size dimensions in the microscale or nanoscale range and the array having a pitch in the microscale or nanoscale range.

22. The method of claim 21, further comprising the step of:
(d) printing or assembling a second microscale or nanoscale thermal emitter in thermal contact with an outer surface of an outer package of the device; the second emitter configured to absorb thermal energy from the outer package and emit NIR radiation away from the outer package.

23. The method of claim 21, further comprising the step of:
(e) encapsulating the nanostructures of the absorber in a dielectric material capable of transmitting the NIR radiation emitted by the first emitter.

24. The method of claim 21, wherein the first emitter is printed or assembled at a location that provides thermal stress or forms a hot spot of the component.

25. The method of claim 21, wherein a plurality of first emitters and absorbers are printed or assembled at different locations in the device.

* * * * *